United States Patent [19]

Arai et al.

[11] Patent Number: 5,644,003

[45] Date of Patent: Jul. 1, 1997

[54] EPOXY RESIN COMPOSITION, PROCESS FOR PRODUCING THE SAME AND RESIN-SEALED SEMICONDUCTOR DEVICE

[75] Inventors: Noriyuki Arai, Tsukuba; Yutaka Shiomi, Toyonaka; Hiroshi Nakamura, Tsuchiura; Noriaki Saito, Toyonaka, all of Japan

[73] Assignee: Sumitomo Chemical Company, Ltd., Osaka, Japan

[21] Appl. No.: 503,668

[22] Filed: Jul. 18, 1995

[30] Foreign Application Priority Data

Jul. 19, 1994 [JP] Japan .................... 6-166945
Oct. 20, 1994 [JP] Japan .................... 6-255102
Nov. 10, 1994 [JP] Japan .................... 6-276568

[51] Int. Cl.$^6$ .................... C08F 283/04; C08L 63/00
[52] U.S. Cl. .................... 525/423; 525/481; 525/485; 525/523; 525/534; 525/935; 528/93; 528/96; 523/440; 428/361; 428/413; 428/474.4; 428/901
[58] Field of Search .................... 525/423, 481, 525/485, 523, 534, 935; 528/93, 96; 523/440; 428/413, 361, 474.4, 901

[56] References Cited

U.S. PATENT DOCUMENTS

| | | | |
|---|---|---|---|
| 4,511,623 | 4/1985 | Yoon et al. | 428/359 |
| 4,593,052 | 6/1986 | Irving | 522/31 |
| 4,656,203 | 4/1987 | Parker | 523/155 |
| 4,775,705 | 10/1988 | Parker et al. | 523/153 |
| 4,833,191 | 5/1989 | Bushway et al. | 525/178 |
| 4,855,339 | 8/1989 | Saito et al. | 523/400 |
| 4,923,902 | 5/1990 | Wycech | 521/54 |
| 5,302,672 | 4/1994 | Ogura et al. | 525/481 |
| 5,324,811 | 6/1994 | You et al. | 528/336 |
| 5,371,153 | 12/1994 | Kuribayashi et al. | 525/423 |
| 5,474,842 | 12/1995 | Hoiness | 428/327 |

FOREIGN PATENT DOCUMENTS

| | | |
|---|---|---|
| 60-137537 | 10/1986 | Japan. |
| 5-206524 | 6/1994 | Japan. |
| 95/19466 A1 | 7/1995 | WIPO. |

OTHER PUBLICATIONS

Database PAJ on EPO (Munich, DE) PN:JP 6–107 771 A, 19 Apr. 1994 (Abstract).
JAP & JAPIO Abstract No. 03080267 & JP 2055767, 26 Feb. 1990.
WPI Abstract Accession No. 87–317629/45 & JP 62225539 A, 3 Oct. 1987.
WPI Abstract Accession No. 87–310042/44 & JP 62218425 A, 25 Sep. 1987.

*Primary Examiner*—Melvyn I. Marquis
*Assistant Examiner*—R. Gulakowski
*Attorney, Agent, or Firm*—Cushman Darby & Cushman IP Group of Pillsbury Madison & Sutro, LLP

[57] ABSTRACT

An epoxy resin composition which comprises: (a) an epoxy resin having at least two epoxy groups in the molecule, (b) an epoxy resin curing agent, (c) a cure accelerator, (d) an aromatic polyamide pulp and (e) an inorganic filler as the essential components, the aromatic polyamide pulp (d) being contained in an amount of 0.5 to 10% by weight based on the total weight of the component (a), the component (b) and the component (d), and the inorganic filler (e) being contained in an amount of 75 to 94% by weight based on the total weight of the component (a), the component (b), the component (c) and the component (e), and a semiconductor device sealed with the above epoxy resin composition. The cured product of the epoxy resin composition is good in balance of hot impact strength and hot flexural strength and hence, the semiconductor device sealed with the epoxy resin composition is excellent in soldering resistance.

16 Claims, No Drawings

EPOXY RESIN COMPOSITION, PROCESS FOR PRODUCING THE SAME AND RESIN-SEALED SEMICONDUCTOR DEVICE

BACKGROUND OF THE INVENTION

This invention relates to an epoxy resin composition useful for sealing electronic parts, to a process for producing the same, and to a resin-sealed semiconductor device.

In recent years, transfer molding has been conducted using an economically advantageous epoxy resin for sealing a semiconductor such as LSI, IC, transistor and the like.

In particular, quite recently, the surface mounting of LSI has been conducted and the case of direct immersion in a solder bath has been increased. In this case, the sealing material is exposed to a high temperature not lower than 200° C., and hence, such a problem occurs that the moisture contained in the sealing material is vaporized and expanded to cause cracks or cause peeling at the interface with a die pad.

At present, the mainstream is a sealing material in which a glycidyl ether of o-cresol novolak is used as an epoxy resin and a phenol novolak is used as a curing agent. Because of the above problem, however, the sealing material is practically used in the moistureproof package form.

Hence, the resin sealing material is strongly required to have soldering resistance. In general, for improving the crack resistance, modification with a rubber such as butadiene-acrylonitrile copolymer rubber, silicone rubber or the like is effected, thereby improving the impact resistance. However, the rubber-modification results in a reduction in strength and modulus of elasticity though the impact resistance can be improved, and hence, the rubber-modification is not a preferable method for the improvement of the soldering resistance aimed at in this invention.

Under such circumstances, the present inventors have made extensive research on an epoxy resin composition excellent in soldering resistance and have consequently found that an epoxy resin composition containing an aromatic polyamide pulp and highly filled with an inorganic filler can solve the above-mentioned problems.

SUMMARY OF THE INVENTION

The objects of this invention are to provide an epoxy resin composition which can give a cured product having excellent soldering resistance and well balanced hot impact strength and hot flexural strength, to provide a process for producing the epoxy resin composition, and to provide a semiconductor device sealed with the above epoxy resin composition.

Other objects and advantages of this invention will become apparent from the following description.

According to this invention, there is provided an epoxy resin composition comprising:

(a) an epoxy resin having at least two epoxy groups in the molecule, (b) an epoxy resin curing agent, (c) a cure accelerator, (d) an aromatic polyamide pulp, and (e) an inorganic filler as the essential components, the aromatic polyamide pulp of the component (d) being contained in an amount of 0.5 to 10% by weight based on the total weight of the component (a), the component (b) and the component (d), and the inorganic filler (e) being contained in an amount of 75 to 95% by weight based on the total weight of the component (a), the component (b), the component (c) and the component (e), and a process for producing an epoxy resin composition capable of giving a cured product having excellent resistance to solder cracking and well balanced hot impact strength and hot flexural strength, which comprises the steps of:

(A) melting (a) an epoxy resin having at least two epoxy groups in the molecule so that the viscosity of the epoxy resin (a) falls within the range of from 200 to 10,000 centipoises, (B) kneading the epoxy resin (a) in such a molten state with (d) an aromatic polyamide pulp to form a resin mixture, and (C) uniformly mixing the resin mixture with (b) an epoxy resin curing agent, (c) a cure accelerator and (e) an inorganic filler, in such amount that an amount of the component (d) falls within the range of from 0.5 to 10% by weight based on the total weight of the component (a), the component (b) and the component (d), and an amount of the component (e) falls within the range of from 75 to 94% by weight based on the total weight of the component (a), the component (b), the component (c) and the component (e).

This invention further provides a resin-sealed semiconductor device in which the semiconductor device is sealed with the epoxy resin composition mentioned above and a use of the epoxy resin composition for sealing a semiconductor device.

DETAILED DESCRIPTION OF THE INVENTION

The epoxy resin having at least two epoxy groups in the molecule used as the component (a) in the epoxy resin composition of this invention may be any known one, and examples thereof include, for example, glycidyl ethers derived from dihydric phenols such as hydroquinone, resorcinol, bisphenol A, tetrabromobisphenol A, bisphenol F, tetramethylbiphenol, 4,4'-dihydroxybenzophenone, bis(4-hydroxyphenyl) ether, bis(4-hydroxy-3,5-dimethylphenyl) thioether, dihydroxynaphthalene or derived from trihydric or more hydric phenols such as phloroglucin, pyrogallol and the like; glycidyl ethers of polycondensation products of phenols such as phenol, cresol, xylenol, butylphenol, methylbutylphenol, octylphenol, naphthol and the like including isomers of each with aldehydes such as formaldehyde, acetaldehyde, glyoxal, acrolein, benzaldehyde, hydroxybenzaldehyde and the like or ketones such as cyclohexanone, acetophenone, hydroxyacetophenone and the like; glycidyl ethers of Friedel-Crafts reaction products of the above-mentioned phenols with dicyclopentadiene, dipentene, p-xylylene dichloride, bis(methoxymethyl)benzene and the like; amine type epoxy resins derived from aniline, aminophenol, aminometacresol, diaminodiphenylmethane, diaminodiphenyl ether, bis(aminophenoxy)benzene, bis(aminophenoxyphenyl) propane, phenylenediamine, toluenediamine, xylylenediamine, bis(aminomethyl)cyclohexane and the like including isomers of each; glycidyl ester type compounds derived from aromatic carboxylic acids such as p-oxybenzoic acid, m-oxybenzoic acid, terephthalic acid, isophthalic acid and the like; hydantoin type epoxy compounds derived from 5,5-dimethylhydantoin and the like; alicyclic epoxy resins such as 2,2-bis(3,4-epoxycyclohexyl) propane, 2,2-bis[4-(2,3-epoxypropoxy)cyclohexyl]propane, vinylcyclohexene dioxide, 3,4-epoxycyclohexylmethyl-3,4- epoxycyclohexanecarboxylate and the like; etc. These epoxy resins may be used alone or in combination of two or more. Among them, the glycidyl ethers are preferred in use as a sealing material, and in particular, o-cresol novolak type epoxy resins; glycidyl ethers of polyhydric phenols obtained by condensation of methylbutylphenol with hydroxybenzaldehyde; and dihydric glycidyl ethers derived from tetramethylbiphenol or bis(4-hydroxy-3,5-dimethylphenyl) thioether are preferable in view of curability and moisture resistance.

As the epoxy resin curing agent which is used as the component (b) in this invention, known epoxy resin curing agents may be used, and examples thereof include polyhydric phenols such as bisphenol A, tetrabromobisphenol A, bisphenol F, bisphenol S, bis(4-hydroxyphenyl)cyclohexane, bis(4-hydroxyphenyl)ethane, 1,3,3-trimethyl-1-m-hydroxyphenylindan-5 or 7-ol, 1,3,3-trimethyl-1-p-hydroxyphenylindan-6-ol, resorcinol, hydroquinone, catechol, dihydroxynaphthalene, polycondensation products of the above phenols with the aldehydes as mentioned above or the ketones as mentioned above, Friedel-Crafts type reaction products of the above phenols with dicyclopentadiene, dipentene, p-xylylene dichloride, bis(methoxymethyl)benzene and the like, etc.; polycarboxylic acids such as maleic acid, phthalic acid, nadic acid, methyltetrahydrophthalic acid, methylnadic acid and the like and their anhydrides; polyamine compounds such as diaminodiphenylmethane, diaminodiphenylsulfone, diaminophenyl ether, phenylenediamine, diaminodicyclohexylmethane, xylylenediamine, toluenediamine, diaminodicyclohexane, dichlorodiaminodiphenylmethane (including isomers of each), ethylenediamine, hexamethylenediamine and the like; and compounds having active hydrogen capable of reacting with an epoxy group such as dicyandiamide, tetramethylguanidine and the like. These compounds may be used alone or in combination of two or more. The polyhydric phenols are preferable, and phenol novolaks and reaction products of phenols with dicyclopentadiene, p-xylylene dichloride or bis(methoxymethyl)benzene are more preferable.

The proportions of the epoxy resin of the component (a) and the curing agent of the component (b) are as follows. The amount of the curing agent used is preferably 0.7 to 1.2 equivalents per equivalent of the epoxy group. When the amount of the curing agent is less than 0.7 equivalent or more than 1.2 equivalents per equivalent of the epoxy group, the curing becomes insufficient in each case and there is a possiblilty that a problem is caused in respect of heat resistance.

The cure accelerator of the component (c) used in this invention may be any known cure accelerator, and examples thereof include organic phosphine compounds such as triphenylphosphine, tri-4-methylphenylphosphine, tri-4-methoxyphenylphosphine, tributylphosphine, trioctylphosphine, tri-2-cyanoethylphosphine and the like; tertiary amines such as tributylamine, triethylamine, 1,8-diazabicyclo-(5,4,0)undecene-7, triamylamine and the like; quaternary ammonium salts such as benzyltrimethylammonium chloride, benzyltrimethylammonium hydroxide, triethylammonium tetraphenylborate and the like; imidazoles; and the like. However, the cure accelerator is not limited thereto. Among them, the organic phosphine compounds, 1,8-diazabicyclo-(5,4,0)undecene-7 and triethylammonium tetraphenylborate are preferable in respects of moisture resistance and curability, and triphenylphosphine is particularly preferable. The amount of the cure accelerator (c) used falls within the range of from 0.05 to 10% by weight relative to the weight of the epoxy resin (a), preferably 0.1 to 5% by weight.

The aromatic polyamide pulp used as the component (d) in this invention is a generic name of fibrous materials of aromatic polyamide pulp which have been highly fibrillated by a mechanical or chemical means.

The aromatic polyamide pulp used in this invention is preferably such that the specific surface area thereof measured by the BET method is 3 to 20 $m^2/g$, and the value of freeness measured by the Canadian standard method in JIS P-8121 "Pulp Freeness Test Method" is preferably 100 to 700 ml, more preferably 150 to 700 ml. When the freeness is less than 100 ml, the flowability of the system is impaired and the workability is lowered. When the freeness is more than 700 ml, a sufficient reinforcing effect cannot be desired.

An aromatic polyamide used as the raw material of the aromatic polyamide pulp includes a polymer obtained by a condensation of at least two components selected from the group consisting of aromatic dicarboxylic acid, aromatic diamine, and aromatic aminocarboxylic acid, and a polymer obtained by a condensation of aromatic aminocarboxylic acid. Specifically, examples thereof includes poly(paraphenylene terephthalamide), a copolymer composed of 3–4'-diaminodiphenylether/paraphenylenediamine/terephthaloyl dichloride, and poly(metaphenylene isophthalamide).

The fiber length of the pulp used in this invention is preferably 0.01 to 5 mm from the view point of reinforcing effect and workability.

The proportion of the aromatic polyamide pulp (the component (d)) blended is such that the amount of the component (d) falls within the range of from 0.5 to 10% by weight based on the total weight of the component (a), the component (b), and the component (d), preferably 1 to 10% by weight. When the proportion is more than the above-mentioned range, the flowability and moisture resistance of the composition are decreased, and when the proportion is less than the above range, the composition is not sufficiently toughened.

These pulps may be used after they have been subjected to surface treatment for the purpose of improving the adhesiveness to the resin component in the composition. The surface treatment referred to here includes all the operations for chemically and mechanically treating the pulp surface for enhancing the various performances of the resin composition containing the pulp of this invention and/or the cured products of the resin composition. Among them, in order to allow the cured product of the resin composition of this invention to exhibit the desired performance, that is, allow the semiconductor device sealed with the resin composition of this invention to exhibit excellent performance, it is preferable to conduct the surface treatment of the pulp for improving the adhesiveness of the pulp to the epoxy resin which is a matrix resin. The surface treatment is preferably a surface treatment with a surface treating agent comprising (f) an epoxy resin as an essential component.

The epoxy resin (f) used as the surface treating agent may be any known epoxy resin, and examples thereof include diglycidyl ether compounds derived from dihydric phenols such as bisphenol A and the like; glycidyl ether compounds of polycondensation products of phenols with aldehydes; amine type epoxy resins derived from aminophenol, aminocresol, diaminodiphenylmethane and the like; glycidyl ester compounds derived from aromatic carboxylic acids such as oxybenzoic acid, terephthalic acid, isophthalic acid and the like; hydantoin type epoxy compounds derived from 5,5-dimethylhydantoin and the like; alicyclic epoxy resins such as 2,2-bis(3,4-epoxycyclohexyl)propane, 2,2-bis

[4-(2,3-epoxypropoxy)cyclohexyl]propane, vinylcyclohexene dioxide, 3,4-epoxycyclohexylmethyl 3,4-epoxycyclohexanecarboxylate and the like; etc. Among them, amine type epoxy resins are preferable in view of enhancing the adhesiveness, and the tetraglycidylamine type epoxy resins in which 4,4'-diaminodiphenylmethane is used as the starting material is particularly preferable. Moreover, the epoxy equivalent of the epoxy resin is preferably 1,000 g/eq or less, and when the epoxy equivalent exceeds 1,000 g/eq, sufficient adhesiveness is not obtained.

The surface treatment method may be any known method. As disclosed in, for example, Japanese Patent Application Kokai No. JP-A-62-218,425, there may be used a method in which the aromatic polyamide pulp is immersed in a solution of an epoxy resin dissolved in an organic solvent to apply the epoxy resin to the surface of the pulp, a method in which the aromatic polyamide pulp is spray-coated with the solution of an epoxy resin in an organic solvent to apply the epoxy resin to the surface of the pulp and a method in which heat treatment is applied at the time of the above immersion in or spray-coating with the solution. In addition, as disclosed in JP-A-62-225,539, there is a method in which when an epoxy resin is applied to the surface of an aromatic polyamide material, heat treatment is effected in the presence of an ammonia gas to improve the adhesiveness of the aromatic polyamide material to the epoxy resin. Also, a method of obtaining a surface-treated aromatic polyamide material by treating an aromatic polyamide material with an aqueous emulsion of an epoxy resin and then heat-dehydrating the same.

Among these methods, the method using the aqueous emulsion of the epoxy resin is particularly preferable, and generally used methods can be applied as they are. For example, an epoxy resin emulsion can be used which is obtained by dispersing an epoxy resin in water in the presence of a nonionic surfactant such as an ether compound of polyoxyethylene with a higher aliphatic alcohol or the like by high speed stirring.

The epoxy resin/surfactant ratio (by weight) in this case can be varied with the kinds of the epoxy resin and surfactant; however, it is preferable to select the ratio in a range of from 97/3 to 70/30 from the viewpoint of emulsion stability, adhesiveness and the like. From the viewpoint of uniformity of treatment, the emulsion particles have preferably a diameter of 15 μm or less, more preferably a diameter of 5 μm or less.

In order to increase the amount of the epoxy resin to be adsorbed on the pulp in the treating solution, it is particularly preferable to hydrolyze a part of the glycidyl groups of the epoxy resin in the epoxy resin emulsion into glycol groups and then use the thus treated emulsion because the thus treated emulsion enables the epoxy resin to be adsorbed on the aromatic polyamide pulp approximately 100% without using any other particular means.

In order to obtain an epoxy resin emulsion in which a part of the glycidyl groups have been hydrolyzed into glycol groups, there are a method of preparing an emulsion dispersion using as the starting material an epoxy resin which has been hydrolyzed in a generally known manner and a method in which an emulsion is previously prepared in a conventional manner and then subjected to hydrolysis. According to the latter method, a uniform and stable emulsion can be easily obtained. For hydrolyzing an epoxy resin, various methods can be used depending upon the kind of the emulsion; however, it is the simplest method and preferable to heat-treat the emulsion as it is. As a result of the hydrolysis, a part of the glycidyl groups of the epoxy resin are ring-opened to change into glycol groups. The percentage of hydrolysis reaction is preferably at least 10%, more preferably at least 20%, but less than 90% of the glycidyl group existing before the hydrolysis from the viewpoint of adsorbability on the pulp and adhesiveness to the matrix resin.

The aromatic polyamide pulp used in this invention may be that which has been subjected to such a treatment as hot water washing or the like to reduce the amount of ions. The thus treated pulp is such that the amount of ions extracted in the pressure cooker test which will described in detail hereinafter is preferably 0.7% by weight or less, more preferably 0.2% by weight or less and most preferably 0.05% by weight or less, of the weight of the pulp. When said amount of ions is more than 0.7% by weight, the insulation resistance after moisture absorption of the cured product of the epoxy resin composition is lowered, so that said amount of ions is not desirable in view of moisture resistance reliability.

The pressure cooker test is effected by placing 2.0 g of a sample and 48.0 g of deionized (ion-exchanged) water in a tightly sealed pressure Teflon vessel, maintaining them at 121° C. for 24 hours and then subjecting them to various measurements. In this case, the ion content extracted with the deionized water is measured by an ion chromatography.

The inorganic filler used as the component (e) in this invention includes silica, alumina, titanium white, aluminum hydroxide, talc, clay, glass fiber and the like. In particular, silica (molten silica or synthetic silica) and alumina are preferred. The proportion of the inorganic filler blended is required to be 75 to 94% by weight, preferably 80 to 92% by weight, of the total weight of the component (a), the component (b), the component (c) and the component (e). When the amount of the filler is smaller than the above, the hot strength of the cured product is low, the amount of water absorbed becomes large and the cured product becomes inferior in resistance to solder cracking. When the amount of the filler is larger than the above, a problem is caused in respect of moldability, particularly flow properties. The inorganic filler used in this invention may be in various forms such as spherical form, fragment form and the like. Also, it is possible to use a mixture of several fillers having different sizes. In particularly, in order to highly fill the resin composition with the inorganic filler as in this invention, the use of only the fragment form filler is not desirable because it results in an inferior fluidity, and hence, it is preferable to use at least one spherical form filler. In this case, the amount of the spherical form filler used is at least 1% by weight but less than 100% by weight, preferably at least 10% by weight but 95% by weight or less. However, when the spherical form filler is used alone, the surface area becomes small and hence a problem is caused in respect of moldability, for example, the amount of flash increases. Therefore, it is preferable to use the spherical form filler and the fragment form filler in combination.

To the epoxy resin composition of this invention, if necessary, it may be added thereto a release agent such as a natural wax, a synthetic wax, a higher aliphatic acid, a metal salt of the higher aliphatic acid, a paraffin or the like; a coloring agent such as carbon black or the like; a surface-treating agent such as a silane coupling agent or the like; and the like. Also, it may be added to the epoxy resin composition, a flame retardant such as antimony trioxide, a phosphorus compound, a brominated epoxy resin or the like. The brominated epoxy resin is particularly preferred for allowing the epoxy resin composition to exhibit a flame retardant effect.

In order to make the epoxy resin composition of this invention low in inner stress, various elastomers may be added to the epoxy resin composition or previously reacted with the epoxy resin so far as the effect of this invention is not impaired. Specifically, addition type and reaction type elastomers such as polybutadiene, butadiene-acrylonitrile copolymer, silicone rubber, silicone oil and the like are included.

In this invention, for previously kneading the epoxy resin with the aromatic polyamide pulp to prepare a resin mixture, the epoxy resin may be melted so as to have a viscosity ranging from 200 to 10,000 centipoises and mixing the molten epoxy resin with the pulp. When the viscosity of the epoxy resin is less than 200 centipoises, it is impossible to uniformly disperse the pulp in the epoxy resin, and when the viscosity is more than 10,000 centipoises, a great power is required for the mixing and hence such a viscosity is commercially disadvantageous.

For uniformly mixing the resin mixture with the epoxy resin curing agent which is the component (b), the cure accelerator which is the component (c) and the inorganic filler which is the component (e), a method using heated twin roll or other methods may be used.

In order to seal an electronic part such as semiconductor or the like with the epoxy resin composition of this invention, the epoxy resin composition may be molded by a heretofore known molding method such as transfer molding, compression molding, injection molding or the like.

The cured product of the epoxy resin composition of this invention is excellent in balance of hot impact strength and hot flexural strength and hence the epoxy resin composition is particularly useful as a material for sealing an electronic part, and the electronic part sealed with the epoxy resin composition is excellent in soldering resistance.

DESCRIPTION OF THE PREFERRED EMBODIMENTS

Examples of this invention are described below; however, this invention should not be construed to be limited thereto.

In the Examples, the epoxy equivalent is defined as the molecular weight of an epoxy resin per one epoxy group.

The evaluation of mixture and cured molded article was conducted by the following methods.

Glass transition temperature: Measured using a thermo-mechanical analyzer (SHIMADZU DT-30).

Barcol hardness: Measured according to ASTM D-648 by Model 935 under the conditions of 175° C./2 minutes.

Hot flexural strength and hot flexural modulus: Measured according to JIS K-6911 by an Instron type universal tester (SHIMADZU IS-10T). The measurement temperature was 240° C.

Water absorption: A weight change under the conditions of 85° C./85% RH (relative humidity) was measured using a thermohygrostat (TABAI PR-2).

Spiral flow: Measured according to EMMI-1-66 under the conditions of 175° C./70 kg/cm$^2$.

Hot impact strength: Measured by a Charpy impact tester (Ueshima U-F IMPACT TESTER). The measurement temperature was 240° C.

Soldering resistance: The number of ICs, in which cracks were caused, was measured after a 52 pin QFP package sample having a package thickness of 2.05 mm had been subjected to moisture absorption under the conditions of 85° C./85% RH/72 hours and immediately thereafter placed and immersed in a solder bath at 240° C. for 30 seconds. The number of the tested samples was 16.

Moisture resistance reliability: A disc having a diameter of 50 mm and a thickness of 2 mm was prepared and subjected to pressure cooker test and insulation resistance was measured from 0 hour to 1,000 hours by an insulation resistance measuring apparatus (manufactured by Toyo Seiki Seisakusho) and the moisture resistance reliability was evaluated based on the results obtained.

Example 1

One hundred grams of a glycidyl ether of o-cresol novolak (Sumiepoxy ESCN-195, a trade name of Sumitomo Chemical Co., Ltd.) as an epoxy resin and 3 g of an aromatic polyamide pulp (Towaron 1097, a trade name of Nippon Aramid Yugen Kaisha) were weighed and placed in a three-necked flask. Thereafter, the temperature of the contents of the flask was elevated to 140° C. in an oil bath. The epoxy resin used in the present experiment had a viscosity at 140° C. of 500 centipoises (viscosity measurement: Rheomat-30 manufactured by Contraves Company). The mixture in the flask was stirred for 30 minutes under a nitrogen atmosphere. Incidentally, the stirring speed was 200 rpm. Thereafter, the resin composition obtained was taken out and subjected to evaluation of pulp dispersion state. The evaluation was conducted according to the NEP index proposed by DU PONT DE NEMOURS & COMPANY. The evaluation method is described in detail below.

Eleven grams of the resin composition consisting of the epoxy resin and the pulp obtained above was weighed and put on the center of a transparent glass plate. Another transparent glass plate was put thereon. At the center of said another glass plate, four squares each having a size of 4 cm×4 cm had been graved. Said another glass plate was pushed to spread the resin composition into a disk form of about 15 cm in diameter, and the pillins observed in the squares were classified based on the size as shown in Table 1 and counted.

TABLE 1

| Class | Diameter of pilling |
| --- | --- |
| Large | 3.2 mm or more but less than 5.1 mm |
| Middle | 1.6 mm or more but less than 3.2 mm |
| Small | less than 1.6 mm |

Incidentally, the case where pillins having a diameter of 5.1 mm or more existed was judged as undispersible. This operation was repeated twice and the NEP index was determined according to the following equation:

$$\text{NEP index} = [(\text{number of large pillings} \times 3) + (\text{number of middle pillings} \times 2) + (\text{number of small pillings} \times 1)] \times \tfrac{1}{2}.$$

The case where the NEP index determined according to the equation was small was judged as good in dispersibility.

The NEP index of the resin composition of Example 1 evaluated by the above evaluation method was 39. As a result, in the resin composition of Example 1, the pulp was understood to be uniformly dispersed.

Example 2

One hundred grams of a glycidyl ether of bisphenol A (Sumiepoxy ELA-128, a trade name of Sumitomo Chemical Co., Ltd.) as an epoxy resin and 5 g of an aromatic polyamide pulp (Towaron 1097, a trade name of Nippon Aramid Yugen Kaisha) were weighed and placed in a three-necked flask under an atmosphere at 25° C. The epoxy resin used in the present experiment had a viscosity at 25° C. of 8,000 centipoises (viscosity measurement: Rheomat-30 manufactured by Contraves Company). The mixture was stirred for 30 minutes under a nitrogen atmosphere. Incidentally, the stirring speed was 200 rpm. Thereafter, the resin composition was taken out and subjected to evaluation of pulp dispersion state. The evaluation was conducted according to the above ENP index. As a result, the NEP index was 12, from which the pulp was understood to be uniformely dispersed.

Comparative Example 1

One hundred grams of a normally solid glycidyl ether of o-cresol novolak (Sumiepoxy ESCN-195, a trade name of Sumitomo Chemical Co., Ltd.) as an epoxy resin and 3 g of an aromatic polyamide pulp (Towaron 1097, a trade name of Nippon Aramid Yugen Kaisha) were weighed, and placed along with 20 g of dry ice in a grinding mixer (Sample Mill SK-M10R manufactured by Kyoritsu Riko Kabushiki Kaisha). These were ground and mixed at 2,000 rpm for five minutes. The resulting resin composition had an NEP index of 150, from which the dispersion was judged bad.

Comparative Example 2

One hundred grams of a glycidyl ether of bisphenol A (Sumiepoxy ELA-128, a trade name of Sumitomo Chemical Co., Ltd.) as an epoxy resin and 5 g of an aromatic polyamide pulp (Towaron 1097, a trade name of Nippon Aramid Yugen Kaisha) were weighed and placed in a three-necked flask. Thereafter, the temperature of the contents of the flask was elevated to 80° C. in an oil bath. The epoxy resin used in the present experiment had a viscosity at 80° C. of 20 centipoises (viscosity measurement: Rheomat-30 manufactured by Contraves Company). The mixture was stirred for 30 minutes under a nitrogen atmosphere. Incidentally, the stirring speed was 200 rpm. Thereafter, the resin composition was taken out and subjected to evaluation of pulp dispersion state. The evaluation was conducted according to the above NEP index. As a result, pillings having a diameter of 5.1 mm or more existed and hence this case was judged as undispersible.

TABLE 2

| | Example | | Comp. Example | |
|---|---|---|---|---|
| | 1 | 2 | 1 | 2 |
| (Compounding) | | | | |
| Sumiepoxy ESCN-195 | 100 | 0 | 100 | 100 |
| Sumiepoxy ELA-128 | 0 | 100 | 0 | 0 |
| Towaron 1097 | 3.0 | 3.0 | 3.0 | 3.0 |
| Viscosity of epoxy resin when mixed with pulp (cps) | 500 | 8,000 | Cooling and grinding a solid resin and a pulp | 20 |
| NEP index | 39 | 12 | 150 | Undispersible |

Reference Example 1 (Surface Treatment of Aromatic Polyamide Pulp)

In a 200-liter reaction tank, 0.95 kg of Towaron 1099 [a trade name of Nippon Aramid Yugen Kaisha for polyphenylene terephthalamide pulp (specific surface area according to the BET method: 11.4 m$^2$/g)] was dispersed in 100 liters of deionized water. While this dispersion was stirred, 313 g of a polyglycidyl type epoxy emulsion dispersion (ANS-1006, a trade name of Takemoto Yushi Kabushiki Kaisha) whose epoxy equivalent had been adjusted to 270 g/eq by heat-treatment at 65° C. for 130 hours was dropwise added to the dispersion over 2 minutes, and the stirring was continued at room temperature for 30 minutes. Subsequently, the polyphenylene terephthalamide pulp was filtered and the resulting residue was subjected to dehydration until the water content became about 50% by weight to obtain a water-containing aromatic polyamide pulp surface-treated with the epoxy resin whose glycidyl groups had been hydrolyzed about 50%. Subsequently, the pulp was dried at 50° C. until the water content became 6% and thereafter subjected to preliminary opening in a universal mixer Model EM25B (manufactured by TSUKISHIMA KIKAI CO., LTD.) and then to main opening in a single track jet mill Model STJ-200 (manufactured by Seishin Enterprise Co., Ltd.) to obtain a surface-treated pulp having a water content of 5% (referred to hereinafter as the pulp A). The freeness thereof as measured according to JIS P-8121 was 350 ml.

Moreover, the same treatment as above was conducted, except that Towaron 1097 (a trade name of Nippon Aramid Yugen Kaisha for polyphenylene terephthalamide pulp [specific surface area according to the BET method: 6.5 m$^2$/g)] was substituted for the Towaron 1099 to obtain a surface-treated pulp (referred to hereinafter as the pulp B). The freeness thereof according to JIS P-8121 was 590 ml.

Reference Example 2

In a 500-ml eggplant type flask were placed 10 g of aramid (polyphenylene terephthalamide) pulp (Towaron 1097, a trade name of Nippon Aramid Yugen Kaisha) and 500 ml of deionized water and subjected to reflux for one hour in an oil bath. The pulp was separated by filtration and was again placed in the flask, and fresh deionized water was placed in the flask. This operation of filtration and washing was repeated four times, and the pulp separated by filtration was dried at 150° C. for two hours in an oven. The thus obtained hot water-treated pulp (referred to hereinafter as the pulp C) was subjected to pressure cooker test at 121° C. for 24 hours to find that the amount of ions extracted was 0.1% by weight based on the weight of the pulp. This value was about one-fifth smaller than the value of untreated pulp of 0.5% by weight.

Examples 3 to 13 and Comparative Examples 3 to 8

A glycidyl ether of o-cresol novolak (Sumiepoxy ESCN-195, a trade name of Sumitomo Chemical Co., Ltd., having an epoxy equivalent of 195 g/eq and a hydrolyzable chlorine content of 330 ppm) as an epoxy resin was mixed with one of the surface-treated pulps obtained in the Reference Examples and untreated pulp as pulp when the viscosity of the epoxy resin was adjusted to 50 centipoises, to obtain a resin-pulp mixture. Moreover, this resin-pulp mixture was compounded with a phenol novolak (PSM-4261, a trade name of Gun-ei Chemical Industry Co., Ltd., having an OH equivalent of 106 g/eq) as a curing agent, triphenylphosphine as a cure accelerator, one of the surface-treated pulps obtained in the Reference Examples as pulp, fragment molten silica (FS-891, a trade name of DENKI KAGAKU KOGYO K. K.) and spherical molten silica (FB-74, a trade name of DENKI KAGAKU KOGYO K. K.) as inorganic fillers and carnauba wax as a release agent and a coupling agent (SH-6040 a trade name of Toray-Dow Corning Silicone) in the amounts (unit: g) shown in Tables 3 and 4 and these were heat-kneaded by a twin roll (the set temperatures: 110° C. on the high temperature side and 50° C. on the low temperature side) to conduct transfer molding, and furthermore to post-cure in a oven at a temperature of 180° C. for 5 hours to obtain a cured molded articles. The physical properties of the kneaded product and the cured molded articles obtained are shown in Tables 3 and 4.

As shown in Tables 3 and 4, the epoxy resin composition in which the pulp was used and the resin was highly filled with the inorganic filler are greatly improved in soldering resistance as compared with the epoxy resin composition in which the pulp was used but the epoxy resin was not highly filled with the inorganic filler or the resin was highly filled with the inorganic filler but the pulp was not used.

Also, the cured product had a good balance of hot impact strength and hot flexural strength.

TABLE 3

| Example No. | | 3 | 4 | 5 | 6 | 7 | 8 |
|---|---|---|---|---|---|---|---|
| (Compounding recipe) | | | | | | | |
| Sumiepoxy ESCN-195 | | 100 | 100 | 100 | 100 | 100 | 100 |
| Phenol novolak (PSM-4261) | | 53.8 | 53.8 | 53.8 | 53.8 | 53.8 | 53.8 |
| Towaron 1099 | | — | — | 3.0 | 2.0 | — | — |
| Towaron 1097 | | — | — | — | — | 3.0 | — |
| Pulp A | | 3.0 | — | — | — | — | 3.0 |
| Pulp B | | — | 3.0 | — | — | — | — |
| Triphenylphosphine | | 1.5 | 1.5 | 1.5 | 1.5 | 1.5 | 1.5 |
| Carnauba wax | | 1.5 | 1.5 | 1.5 | 1.5 | 1.5 | 1.5 |
| Silane coupling agent (SH6040) | | 2.0 | 2.0 | 2.0 | 2.0 | 2.0 | 2.0 |
| Fragment Silica | | 181 | 181 | 123 | 123 | 123 | 123 |
| Spherical silica | | 724 | 724 | 492 | 492 | | |

| Example No. | | 9 | 10 | 11 | 12 | 13 |
|---|---|---|---|---|---|---|
| (Compounding recipe) | | | | | | |
| Sumiepoxy ESCN-195 | | 100 | 100 | 100 | 100 | 100 |
| Phenol novolak (PSM-4261) | | 53.8 | 53.8 | 53.8 | 53.8 | 53.8 |
| Towaron 1099 | | — | — | — | — | — |
| Towaron 1097 | | — | — | — | — | — |
| Pulp A | | 2.0 | 1.5 | — | 3.0 | 6.0 |
| Pulp B | | — | — | 3.0 | — | — |
| Triphenylphosphine | | 1.5 | 1.5 | 1.5 | 1.5 | 1.5 |
| Carnauba wax | | 1.5 | 1.5 | 1.5 | 1.5 | 1.5 |
| Silane coupling agent (SH6040) | | 2.0 | 2.0 | 2.0 | 2.0 | 2.0 |
| Fragment Silica | | 123 | 123 | 123 | 103 | 103 |
| Spherical silica | | 492 | 492 | 492 | 410 | 410 |

| Example No. | | 3 | 4 | 5 | 6 | 7 | 8 |
|---|---|---|---|---|---|---|---|
| (Physical properties) | | | | | | | |
| Spiral flow | inch | 21.5 | 21.8 | 24.5 | 25.0 | 24.8 | 24.8 |
| Bacol hardness | — | 78 | 79 | 78 | 78 | 77 | 75 |
| Glass transition temp. | °C. | 158 | 157 | 157 | 157 | 156 | 157 |
| Hot flexural strength | kg/mm$^2$ | 2.11 | 2.10 | 2.01 | 1.95 | 1.98 | 2.01 |
| Hot flexural module | kg/mm$^2$ | 169 | 167 | 160 | 159 | 155 | 159 |
| Water absorption (72 hrs.) | % | 0.25 | 0.24 | 0.28 | 0.28 | 0.28 | 0.26 |
| Hot impact strength | kg/cm | 2.01 | 2.03 | 2.45 | 2.20 | 2.35 | 2.50 |
| Insulation resistance (500 hrs.) | Ωcm | — | — | — | $9.6 \times 10^{13}$ | $8.1 \times 10^{13}$ | — |
| Soldering resistance | Number of ICs | 0 | 0 | 0 | 0 | 0 | 0 |

| Example No. | | 9 | 10 | 11 | 12 | 13 |
|---|---|---|---|---|---|---|
| (Physical properties) | | | | | | |
| Spiral flow | inch | 25.0 | 25.0 | 24.9 | 34.6 | 29.4 |
| Bacol hardness | — | 76 | 76 | 77 | 74 | 71 |
| Glass transition temp. | °C. | 156 | 156 | 155 | 158 | 157 |
| Hot flexural strength | kg/mm$^2$ | 1.96 | 1.81 | 1.99 | 1.65 | 1.86 |
| Hot flexural module | kg/mm$^2$ | 158 | 149 | 156 | 126 | 130 |

TABLE 3-continued

| | | | | | | |
|---|---|---|---|---|---|---|
| Water absorption (72 hrs.) | % | 0.27 | 0.27 | 0.26 | 0.28 | 0.29 |
| Hot impact strength | kg/cm | 2.22 | 2.05 | 2.49 | 2.22 | 2.31 |
| Insulation resistance (500 hrs.) | Ωcm | $1.2 \times 10^{14}$ | — | $1.1 \times 10^{14}$ | — | — |
| Soldering resistance | Number of ICs | 0 | 0 | 0 | 2 | 1 |

TABLE 4

| Comparative Example No. | | 3 | 4 | 5 | 6 | 7 | 8 |
|---|---|---|---|---|---|---|---|
| (Compounding recipe) | | | | | | | |
| Sumiepoxy ESCN-195 | | 100 | 100 | 100 | 100 | 100 | 100 |
| Phenol novolak (PSM-4261) | | 53.8 | 53.8 | 53.8 | 53.8 | 53.8 | 53.8 |
| Towaron 1099 | | — | — | — | — | — | — |
| Towaron 1095 | | — | — | — | — | — | — |
| Pulp A | | — | — | — | — | 6.0 | 15.0 |
| Pulp B | | — | — | — | — | — | — |
| Triphenylphosphine | | 1.5 | 1.5 | 1.5 | 1.5 | 1.5 | 1.5 |
| Carnauba wax | | 1.5 | 1.5 | 1.5 | 1.5 | 1.5 | 1.5 |
| Silane coupling agent (SH6040) | | 2.0 | 2.0 | 2.0 | 2.0 | 2.0 | 2.0 |
| Fragment Silica | | 181 | 123 | 103 | 72 | 72 | 72 |
| Spherical silica | | 724 | 492 | 410 | 287 | 287 | 287 |
| (Physical properties) | | | | | | | |
| Spiral flow | inch | 22.8 | 25.7 | 35.3 | 44.5 | 33.3 | 21.4 |
| Bacol hardness | — | 77 | 76 | 75 | 73 | 75 | 74 |
| Glass transition temp. | °C. | 157 | 155 | 156 | 154 | 155 | 156 |
| Hot flexural strength | kg/mm$^2$ | 2.03 | 1.46 | 1.23 | 0.80 | 0.93 | 1.36 |
| Hot flexural module | kg/mm$^2$ | 159 | 146 | 101 | 62 | 72 | 76 |
| Water absorption (72 hrs.) | % | 0.24 | 0.26 | 0.27 | 0.35 | 0.35 | 0.36 |
| Hot impact strength | kg/cm | 1.19 | 1.89 | 2.23 | 2.57 | 2.81 | 2.76 |
| Insulation resistance (500 hrs.) | Ωcm | $3.3 \times 10^{14}$ | — | — | — | — | — |
| Soldering resistance | Number of ICs | 8 | 10 | 15 | 16 | 10 | 13 |

Examples 14 to 16

Towaron 1097 (the amount of ions extracted when subjected to pressure cooker test at 121° C. for 24 hours was 0.5% by weight based on the weight of the pulp), the pulp C obtained in Reference Example 2 (the amount of ions extracted in the same manner as above was 0.1% by weight) or Technora (a trade name of TEIJIN LTD., the specific surface area according to the BET method: 6.5 m$^2$/g, and the amount of ions extracted in the same manner as above was 0.03% by weight) (referred to hereinafter as the pulp D) were blended as aromatic polyamide pulps in the amounts shown in Table 5, and cured in the same manner as in Example 3 to obtain cured molded articles.

The soldering resistance and insulation resistance of the cured molded articles are shown in Table 5.

From Table 5, it can be understood that the smaller the amount of ions in the pulp, the higher the insulation resistance value after moisture absorption of the cured molded article and the higher the moisture resistance reliability of the cured molded article.

TABLE 5

|  | Example | | | Comparative Example |
| --- | --- | --- | --- | --- |
| Example No. | 14 | 15 | 16 | 4 |
| (Compounding recipe) | | | | |
| Sumiepoxy ESCN-195 | 100 | 100 | 100 | 100 |
| Phenol novolak (PSM-4261) | 53.8 | 53.8 | 53.8 | 53.8 |
| Towaron 1097 | 3.0 | — | — | — |
| Pulp C (hot-water treated Towaro 1097) | — | 3.0 | — | — |
| Pulp D (Technora) | — | — | 3.0 | — |
| Triphenylphosphine | 1.5 | 1.5 | 1.5 | 1.5 |
| Carnauba wax | 1.5 | 1.5 | 1.5 | 1.5 |
| Silane coupling agent (SH6040) | 2.0 | 2.0 | 2.0 | 2.0 |
| Fragment Silica | 123 | 123 | 123 | 123 |
| Spherical silica | 492 | 492 | 492 | 492 |
| Insulation resistance (500 hrs.) ($\Omega \cdot$ cm) | $1.0 \times 10^{14}$ | $1.5 \times 10^{14}$ | $1.4 \times 10^{14}$ | $3.2 \times 10^{14}$ |
| Soldering resistance (Number of ICs) | 1 | 0 | 0 | 0 |

What is claimed is:

1. An epoxy resin composition which comprises:
   (a) an epoxy resin having at least two epoxy groups in the molecule,
   (b) an epoxy resin curing agent,
   (c) a cure accelerator,
   (d) an aromatic polyamide pulp, and
   (e) an inorganic filler as the essential components, wherein
   the aromatic polyamide pulp (d) is in an amount of 0.5 to 10% by weight based on the total weight of the component (a), the component (b) and the component (d), and the specific surface area of the aromatic polyamide pulp (d) measured according to the BET method falls within the range of from 3 to 20 m²/g and the freeness of the pulp as measured by the Canadian standard method in JIS P-8121 falls within the range of from 100 to 700 ml; and
   the inorganic filler (e) is in an amount of 75 to 94% by weight based on the total weight of the component (a), the component (b), the component (c) and the component (e).

2. The epoxy resin composition according to claim 1, wherein the aromatic polyamide pulp is an aromatic polyamide pulp previously surface-treated with a surface-treating agent comprising (f) an epoxy resin as an essential component.

3. The epoxy resin composition according to claim 1, wherein the epoxy resin composition is obtained by kneading the epoxy resin having at least two epoxy groups in the molecule (a) in such a molten state that the viscosity of the epoxy resin (a) falls within the range of from 200 to 10,000 centipoises, with the aromatic polyamide pulp (d) to form a resin mixture, and uniformly mixing the resin mixture with the component (b), the component (c) and the component (e).

4. The epoxy resin composition according to claim 1, wherein the epoxy resin (a) is o-cresol novolak type epoxy resins, the epoxy resin curing agent (b) is polyhydric phenols, the cure accelerator (c) is selected from the group consisting of organic phosphine compounds, 1,8-diazabicyclo(5,4,0)undecene-7 and triethylammonium tetraphenylborate, and the inorganic filler (e) is selected from the group consisting of silica and alumina.

5. The epoxy resin composition according to claim 1, wherein the aromatic polyamide pulp (d) is polyphenylene terephthalamide pulp.

6. The epoxy resin composition according to claim 1, wherein the aromatic polymaide pulp (d) has the fiber length of from 0.01 to 5 mm.

7. The epoxy resin composition according to claim 2, wherein the surface-treating agent is an epoxy resin emulsion.

8. The epoxy resin composition according to claim 2, wherein the surface-treating agent is an epoxy resin emulsion in which 10% or more of glycidyl groups in the epoxy resin are hydrolyzed to form glycol groups.

9. The epoxy resin composition according to claim 1, wherein the amount of the curing agent (b) falls within the range of from 0.7 to 1.2 equivalents per equivalent of epoxy groups in the epoxy resin having at least two epoxy groups (a).

10. A resin-sealed semiconductor device in which the semiconductor device is sealed with the epoxy resin composition according to claim 1.

11. A process for producing an epoxy resin composition capable of giving a cured product having excellent soldering resistance and well balanced hot impact strength and hot flexural strength, which comprises the steps of:
   (A) melting (a) an epoxy resin having at least two epoxy groups in the molecule so that the viscosity of the epoxy resin (a) falls within the range of from 200 to 10,000 centipoises,
   (B) kneading the epoxy resin (a) in such a molten state with (d) an aromatic polyamide pulp to form a resin mixture, and
   (C) uniformly mixing the resin mixture with (b) an epoxy resin curing agent, (c) a cure accelerator and (e) an inorganic filler,
   in such amount that the amount of the component (d) falls within the range of from 0.5 to 10% by weight based on the total weight of the component (a), the component (b) and the component (d), and the amount of the component (e) falls within the range of from 75 to 94% by weight based on the total weight of the component (a), the component (b), the component (c) and the component (e).

12. The process for producing an epoxy resin composition according to claim 11, wherein the step (B) includes the step of selecting (d) an aromatic polymaide pulp having the specific surface area measured according to the BET method of from 3 to 20 m²/g and the freeness as measured by the Canadian standard method in JIS P-8121 of from 100 to 700 ml.

13. The process for producing an epoxy resin composition according to claim 11, further including the step, prior to the step (B), of surface-treating the aromatic polymaide pulp (d) with a surface-treating agent comprising (f) an epoxy resin as an essential component.

14. The process for producing an epoxy resin composition according to claim 13, within the step of surface-treating the aromatic polymaide pulp (d) includes the steps of dispersing the epoxy resin (f) in water in the presence of a nonionic surfactant to form an epoxy resin emulsion and surface-treating the aromatic polymaide pulp (d) with the epoxy resin emulsion.

15. The process for producing an epoxy resin composition according to claim 14, wherein the step of surface-treating the aromatic polyamide pulp (d) includes the steps of heat-treating the epoxy resin emulsion to hydrolyze 10% or more of glycidyl groups in the epoxy resin in the epoxy resin emulsion to form glycol groups and surface-treating the aromatic polyamide pulp (d) with the epoxy resin emulsion having glycol groups.

16. A semiconductor device sealed with an epoxy resin composition according to claim 1.

* * * * *